United States Patent
Hsiao et al.

(10) Patent No.: US 11,547,021 B2
(45) Date of Patent: Jan. 3, 2023

(54) IMMERSION COOLING SYSTEM AND SERVER SYSTEM HAVING THE SAME

(71) Applicant: Fulian Precision Electronics (Tianjin) Co., LTD., Tianjin (CN)

(72) Inventors: Wei-Hsiang Hsiao, New Taipei (TW); Ying-Tso Lai, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/243,888

(22) Filed: Apr. 29, 2021

(65) Prior Publication Data

US 2022/0151111 A1  May 12, 2022

(30) Foreign Application Priority Data

Nov. 9, 2020 (CN) .......................... 202011242515.4

(51) Int. Cl.
*H05K 7/20* (2006.01)

(52) U.S. Cl.
CPC ..... *H05K 7/20763* (2013.01); *H05K 7/20236* (2013.01); *H05K 7/20263* (2013.01)

(58) Field of Classification Search
CPC .......... H05K 7/20236; H05K 7/20263; H05K 7/20772–20781; H01L 23/473
See application file for complete search history.

(56) References Cited

U.S. PATENT DOCUMENTS

| | | | | |
|---|---|---|---|---|
| 5,506,373 | A  * | 4/1996 | Hoffman | H05K 7/1461 174/391 |
| 6,591,898 | B1 * | 7/2003 | Chu | F28F 3/12 361/698 |
| 7,064,953 | B2 * | 6/2006 | Miller | H05K 7/20236 361/689 |
| 7,119,454 | B1 * | 10/2006 | Chiao | B60L 50/61 307/9.1 |
| 10,874,034 | B1 * | 12/2020 | Chen | H01L 23/473 |
| 2009/0116186 | A1 * | 5/2009 | Wei | G06F 1/20 165/80.3 |
| 2013/0139998 | A1 * | 6/2013 | Hayashi | H01L 23/473 165/47 |
| 2018/0192552 | A1 * | 7/2018 | Tan | H05K 7/20736 |
| 2019/0079568 | A1 * | 3/2019 | Hsiao | H05K 7/20327 |
| 2021/0183812 | A1 * | 6/2021 | Ghosh | H01L 25/50 |

FOREIGN PATENT DOCUMENTS

TW  201302042 A1  1/2013

* cited by examiner

*Primary Examiner* — Zachary Pape
(74) *Attorney, Agent, or Firm* — ScienBiziP, P.C.

(57) ABSTRACT

An immersion cooling system includes a receiving member, a heat dissipation channel, and a heat sink. The receiving member is filled with coolant. The receiving member is connected to an end of the heat sink, and heat-generating entities such as one or more servers are positioned in a cavity of the receiving member. The heat dissipation channel is connected to the cavity and is connected to the heat sink. The heat dissipation channel communicates with the cavity and allows circulation of the coolant in the channel, the heat sink cooling down the coolant flowing into heat dissipation channel from the cavity. The immersion cooling system is compact, occupies very little space, and is easily installed, maintained, and moved. A server system having the immersion cooling system is also disclosed.

14 Claims, 2 Drawing Sheets

IMMERSION COOLING SYSTEM AND SERVER SYSTEM HAVING THE SAME

FIELD

The present disclosure relates to field of environmental engineering, and in particular to an immersion cooling system and a server system having the same.

BACKGROUND

In a traditional server cooling system, flat plate heat exchangers and cooling towers are used to cool the server, a heat-generating entity, and heat is dispersed out of the server. Plate-like heat exchangers and cooling towers occupy a large space and may have complex constructions. Furthermore, it may be difficult to maintain such a cooling system.

Thus, there is room for improvement within the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

The present application will be described with reference to the accompanying drawings. A number of details are set forth in the following description so as to fully understand the present application. However, the present application can be implemented in many other ways different from those described herein, and those skilled in the art can make improvements without violating the contents of the present application. Therefore, the present application is not to be considered as limiting the scope of the embodiments described herein.

Unless otherwise defined, all technical and scientific terms used herein have the same meaning as commonly understood by one skilled in the art. The terms used in specification of the present application herein are only for describing specific embodiments, and are not intended to limit the present application.

Figure 1:
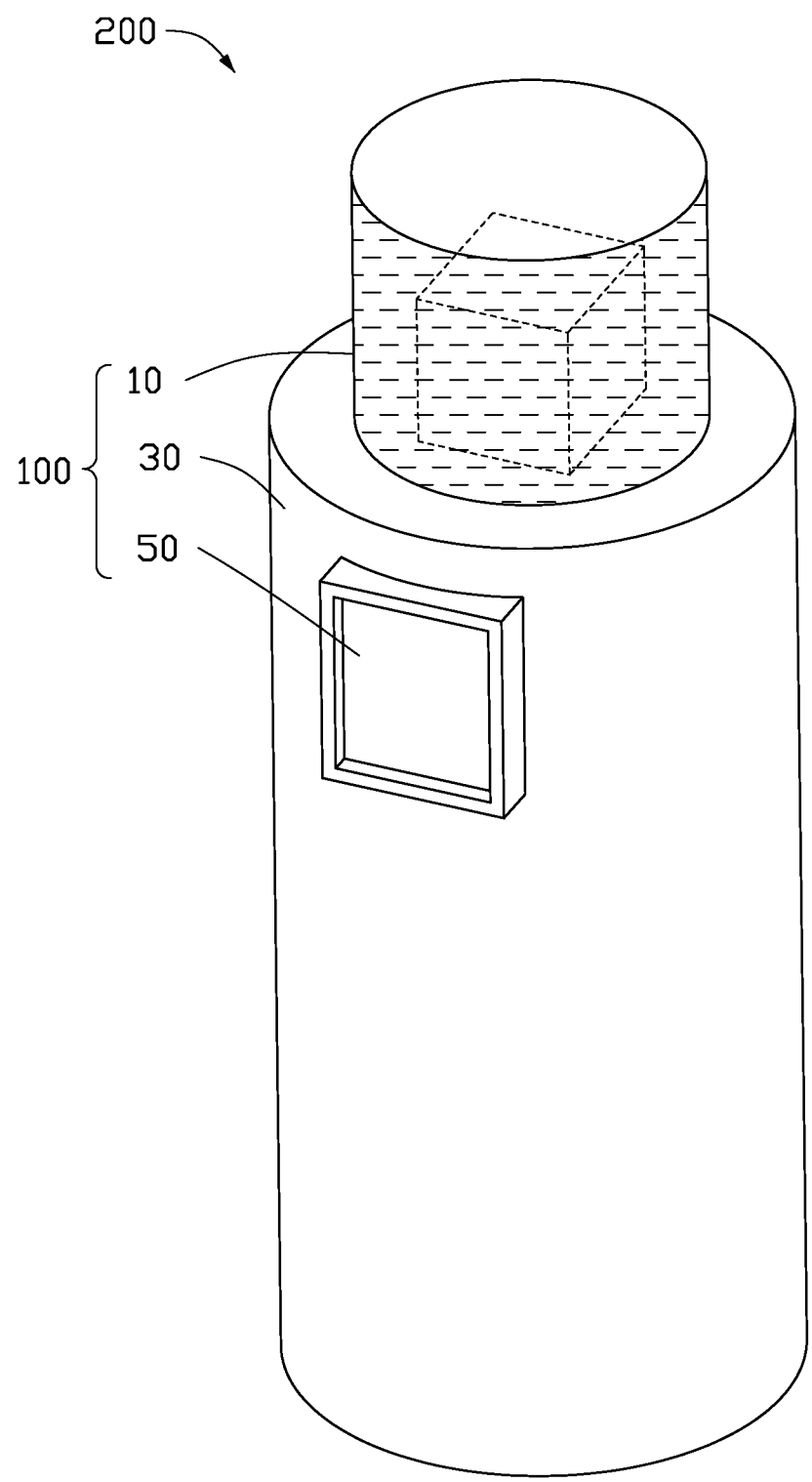
FIG. 1 is a schematic diagram of a structure of an immersion-cooled server system in an embodiment according to the present disclosure.
Figure 2:
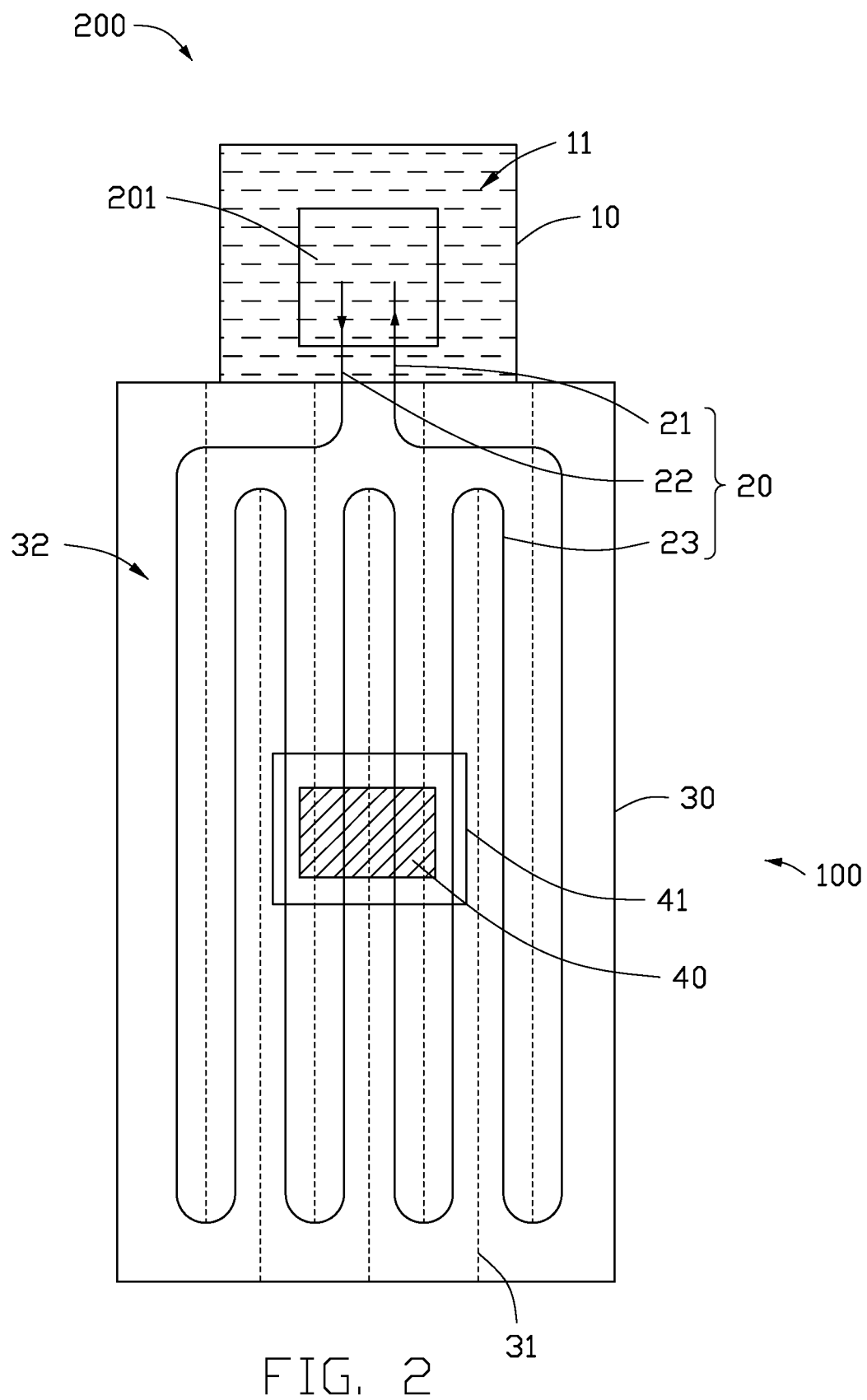
FIG. 2 is a schematic diagram of an internal structure of the server system shown in FIG. 1.

Referring to FIG. 1 and FIG. 2, in an embodiment, the immersion cooling system 100 includes a receiving member 10 and a heat sink 30, the heat sink 30 includes a heat dissipation channel 20. The receiving member 10 defines a cavity 11, a heat-generating entity (heat source) is positioned in the cavity 11, and the heat-generating entity includes but not limited to electronic equipment such as industrial computers and servers. The cavity 11 is configured to receive a coolant, the coolant configured to absorb heat generated by the heat-generating entity positioned in the cavity 11. The receiving member 11 is connected to an end of the heat sink 30. The heat dissipation channel 20 communicates with the cavity 11 and forms a circulation channel with the cavity 11, the heat sink 30 cools down the coolant flowing into heat dissipation channel 20 from the cavity 11.

The coolant after absorbing heat in the cavity 11 enters the heat sink 30 through the heat dissipation channel 20 for cooling, and then flows back to the cavity 11 through the heat dissipation channel 20, so that the coolant can be recycled and used to continuously cool the heat-generating entity. Furthermore, the heat dissipation channel 20 has a loop channel structure. Therefore, the coolant can dissipate heat through natural convection when it enters the inner cavity of the heat sink 30 through the heat dissipation channel 20.

The traditional flat plate heat exchangers and cooling towers can be eliminated in the immersion cooling system 100 of the present disclosure. The immersion cooling system 100 of the present disclosure has advantages of compact structure, small space occupation, and easy installation and maintenance. The structure of the immersion cooling system reduces the difficulty of maintenance.

The present application also discloses a server system 200. The server system 200 includes a central processor 201 and the immersion cooling system 100. The central processor 201 is disposed in the cavity 11 and is immersed in the coolant in the cavity 11, the coolant is a non-conductive material. In the present application, the coolant includes clear, colorless, thermal stable, fully-fluorinated and dielectric liquid for single phase heat transfer applications. The coolant is circulated and cooled through the heat dissipation channel 20 and the heat sink 30, to maintain the operating temperature of the central processor 201 and avoid high temperatures or over temperatures from affecting the operation of the central processor 201.

Referring to FIG. 1, the receiving member 10 is made of a transparent material. A user can observe the height of the coolant in the cavity 11 from the outside, to determine whether the coolant requires replenishment or reduction. The heat sink 30 and the receiving member 10 are cylindrical structures, and the receiving member 10 is fixedly connected to a top end of the heat sink 30. The receiving member 10 and the heat sink 30 are positioned coaxially, so that a center of gravity of the receiving member 10 and the center of gravity of the heat sink 30 may be on a same axis, which helps maintain the stability of the immersion cooling system 100. Since the receiving member 10 is transparent, according to the principle of light refraction, a cylindrical wall of the receiving member 10 can magnify the view of the internal heat-generating entity, which is also helpful for the user to observe the working condition of the heat-generating entity in the cavity 11. The diameter and height of the receiving member 10 are smaller than the diameter and height of the heat sink 30, which is beneficial for lowering the center of gravity of the immersion cooling system 100, thereby improving the stability of the immersion cooling system 100. The stacked receiving member 10 and the heat sink 30 render the structure of the immersion cooling system 100 compact, reducing the space occupied by the immersion cooling system 100, facilitating installation and movement of the immersion cooling system 100, and help in reducing maintenance difficulty and cost.

The immersion cooling system 100 also includes a control panel 50, the control panel 50 is positioned on the outer surface of the heat sink 30. The control panel 50 monitors the working temperature in the cavity 11, and can adjust the flow rate of the coolant according to the temperature required. Therefore, the heat dissipation abilities of the immersion cooling system are adjustable and extensive.

Referring to FIG. 2, the heat dissipation channel 20 includes a liquid inlet tube 21, a liquid outlet tube 22, and a heat dissipation return portion 23. The heat dissipation return portion 23 includes a tube having a plurality of curved portions, and the heat dissipation return portions 23 are positioned in an inner cavity 32 of the heat sink 30. A plurality of heat dissipation fins 31 is positioned in the inner cavity 32 of the heat sink 30. The heat dissipation fins 31 are fitted to the curved portions of the heat dissipation return portion 23. Therefore, the coolant in the heat dissipation return portion 23 can interact with the heat dissipation fins 31 for heat transfer, and reduce the temperature of the coolant through natural convection, without the need for additional cooling equipment such as fans, so that energy consumption and noise of the immersion cooling system 100 are reduced.

The liquid inlet tube 21 and the liquid outlet tube 22 are positioned in the cavity 11 and communicate with the heat dissipation return portion 23. The coolant in the cavity 11 flows into the heat dissipation return portion 23 from the outlet tube 22, and the coolant transfers heat to the heat dissipation fins 31 in the heat dissipation return portion 23, and then the coolant flows back to the cavity 11 from the liquid inlet tube 21.

Furthermore, a driver 40 is positioned in the heat sink 30. The driver 40 drives the flow of the coolant in the heat dissipation channel 20, to achieve circulation of the coolant. The driver 40 is connected to the heat dissipation return portion 23. The control panel 50 is electrically connected to the driver 40, and the driver 40 includes but is not limited to power equipment such as a pump. In one embodiment, a noise reduction structure 41 is further positioned in the heat sink 30. The noise reduction structure 41 damps the noise and vibrations of the driver 40.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An immersion cooling system, comprising:
a heat sink, comprising a heat dissipation channel; and
a receiving member connected to an end of the heat sink, the receiving member defining a cavity, the cavity is configured to receive a coolant,
wherein the heat dissipation channel communicates with the cavity and forms a circulation channel with the cavity, the heat sink is configured to cool down the coolant flows into the heat dissipation channel from the cavity;
wherein the heat sink and the receiving member are cylindrical structures, the receiving member is fixedly connected to a top end of the heat sink, the receiving member and the heat sink are positioned coaxially;
the heat dissipation channel comprises a liquid inlet tube, a liquid outlet tube, and a heat dissipation return portion, the liquid inlet tube and the liquid outlet tube are positioned in the cavity, the heat dissipation return portion is positioned in the heat sink, the liquid inlet tube communicates with an end of the heat dissipation return portion, and the liquid outlet tube communicates with another end of the heat dissipation return portion;
the receiving member is made of a transparent material.

2. The immersion cooling system of claim 1, wherein immersion cooling system further comprises a plurality of heat dissipation fins, the plurality of heat dissipation fins are positioned in the heat sink, and the heat dissipation return portion is fitted with the plurality of heat dissipation fins.

3. The immersion cooling system of claim 1 further comprising a driver positioned in the heat sink, wherein the driver is configured to drive the coolant to flow into the heat dissipation channel.

4. The immersion cooling system of claim 3, wherein the driver is connected to the heat dissipation return part.

5. The immersion cooling system of claim 3 further comprising a noise reduction structure positioned in the heat sink, wherein the noise reduction structure is configured to damp vibrations of the driver.

6. The immersion cooling system of claim 1 further comprising a control panel positioned on an outer surface of the heat sink.

7. The immersion cooling system of claim 1, wherein the immersion cooling system is configured to receive a coolant made of a non-conductive material.

8. The immersion cooling system of claim 1, wherein the diameter and height of the receiving member are smaller than the diameter and height of the heat sink.

9. A server system comprising a central processor, and an immersion cooling system, wherein the immersion cooling system comprising:
a heat sink, comprising a heat dissipation channel; and
a receiving member connected to an end of the heat sink, the receiving member defining a cavity, the cavity is configured to receive a coolant, the central processor is positioned in the cavity, and the central processor is immersed in the coolant in the cavity, the coolant configured to absorb heat generating by the central processor;
wherein the heat dissipation channel communicates with the cavity and forms a circulation channel with the cavity; the coolant after absorbing heat in the cavity enters the heat sink through the heat dissipation channel for cooling, then the coolant flows back to the cavity through the heat dissipation channel;
wherein the heat sink and the receiving member are cylindrical structures, the receiving member is fixedly connected to a top end of the heat sink, the receiving member and the heat sink are positioned coaxially;
the heat dissipation channel comprises a liquid inlet tube, a liquid outlet tube, and a heat dissipation return portion, the liquid inlet tube and the liquid outlet tube are positioned in the cavity, the heat dissipation return portion is positioned in the heat sink, the liquid inlet tube communicates with an end of the heat dissipation return portion, and the liquid outlet tube communicates with another end of the heat dissipation return portion;
the receiving member is made of a transparent material.

10. The server system of claim 9, wherein the server system further comprises a plurality of heat dissipation fins, the plurality of heat dissipation fins are positioned in the heat sink, and the heat dissipation return portion is fitted with the plurality of heat dissipation fins.

11. The server system of claim 9 further comprising a driver positioned in the heat sink, wherein the driver is configured to drive the coolant to flow into the heat dissipation channel.

12. The server system of claim 11 further comprising a noise reduction structure positioned in the heat sink, wherein the noise reduction structure is configured to damp vibrations of the driver.

13. The server system of claim 9 further comprising a control panel positioned on an outer surface of the heat sink.

14. The server system of the claim 9, wherein the diameter and height of the receiving member are smaller than the diameter and height of the heat sink.

\* \* \* \* \*